United States Patent
Chen et al.

(10) Patent No.: US 6,916,703 B2
(45) Date of Patent: *Jul. 12, 2005

(54) METHOD FOR FORMING UNIFORM BOTTOM ELECTRODE IN TRENCH OF TRENCH CAPACITOR

(75) Inventors: Yi-Nan Chen, Taipei (TW); Yi-Chen Chen, Taoyuan (TW)

(73) Assignee: Nanya Technology Corporation, Taoyuan (TW)

( * ) Notice: Subject to any disclaimer, the term of this patent is extended or adjusted under 35 U.S.C. 154(b) by 0 days.

This patent is subject to a terminal disclaimer.

(21) Appl. No.: 10/645,682

(22) Filed: Aug. 21, 2003

(65) Prior Publication Data

US 2004/0235244 A1 Nov. 25, 2004

(30) Foreign Application Priority Data

May 19, 2003 (TW) .................................. 92113437 A

(51) Int. Cl.⁷ .......................................... H01L 21/8242
(52) U.S. Cl. ...................... 438/243; 438/249; 438/713
(58) Field of Search ............................... 438/243–249, 438/386–392, 713

(56) References Cited

U.S. PATENT DOCUMENTS 4,353,086 A 10/1982 Jaccodine et al.
2003/0181016 A1 * 9/2003 Shu ........................... 438/392

* cited by examiner

*Primary Examiner*—H. Jey Tsai
(74) *Attorney, Agent, or Firm*—Quintero Law Office

(57) ABSTRACT

A method for forming a uniform bottom electrode in a trench of a trench capacitor. A semiconductor substrate has a dense trench area and a less dense trench area with a plurality of trenches formed in both areas respectively. A hard mask layer is formed on the semiconductor substrate, and the trenches are filled with the mask layer. The hard mask layer is etched at an angle until the dense trench area and the less dense trench area in the semiconductor substrate are exposed to leave the hard mask layer in the trenches. Finally, the hard mask layers in the trenches are etched, and a uniform thickness of the hard mask layer in each trench is achieved.

14 Claims, 11 Drawing Sheets

US 6,916,703 B2

METHOD FOR FORMING UNIFORM BOTTOM ELECTRODE IN TRENCH OF TRENCH CAPACITOR

BACKGROUND OF THE INVENTION

1. Field of the Invention

The invention relates to a method for forming a bottom electrode, and more particularly to a method for forming bottom electrodes of trench capacitors using uniform mask layers.

2. Description of the Related Art

Data is stored in a DRAM by electric charges in a capacitor of a memory cell. Greater capacitance means more chargers are stored in a capacitor. Therefore, in a larger capacitor, the data is less affected by noise, such as soft errors resulting from foreign particles, and the data stored in the capacitor is more stable.

Reducing the size of individual semiconductor devices to increase their density on an integrated circuit (IC) chip is a topic of great interest to those skilled in the art. This reduces chip size and power consumption, and enables faster chip operation. In order to achieve a memory cell with reduced size, the gate length in a conventional transistor must be reduced to decrease the lateral dimension of the memory cell. However, shorter gate length will result in higher leakage current that cannot be tolerated, and the voltage on the bit line must therefore also be scaled down. This reduces the amount of charge stored on a storage capacitor, and thus requires a larger capacitance to ensure that stored charges are correctly detected.

Presently high density memory includes a stack capacitor and a deep trench capacitor, wherein the deep trench capacitor is formed in a trench deep in a substrate, and the volume on the surface of the substrate is less than the stack capacitor.

U.S. Pat. No. 4,353,086 teaches a complicated method for forming a conventional deep trench capacitor.

FIG. 1a is a top view of a deep trench array of a conventional DRAM, and FIG. 1b is a cross-section at line BB in FIG. 1a.

In FIG. 1a, a channel and S/D of a MOS is formed in an active area 102, and a plurality of gates 104 is arranged perpendicular to a bit line 106. Pairs of deep trenches 112 are formed in an adjoining terminal of each adjoining active area 102. A dotted line 108 is a memory cell. A dotted line 138 acting as a contact to electrically connect the bit line 106 and the S/D.

In FIG. 1b, a p+ type silicon substrate 101 is provided, and a p+ type wall layer 122 is formed thereon, and an n+ type buried layer 120 is formed under the p+ type wall layer 122. The deep trenches 112 are deeply etched into the silicon substrate 101 at a predetermined depth through the p+ type wall 122 and the n+ type buried layer 120. An n+ type diffusion layer 114 is formed as an electrode around a bottom portion of the deep trenches 112. An ON dielectric layer 116 is formed on a sidewall and a bottom surface of the deep trench 112 bottom. The bottom portion of the deep trench 112 is filled with a first poly layer 118 as a storage node. A collar oxide layer 124 is formed on a sidewall of a top portion of the deep trench 112. The top portion of the deep trench 112 is filled with a second poly layer 126. A third poly layer 128 is formed as a buried strap on a top surface of the deep trench 112 to electrically connect the deep trench capacitor and a diffusing area 134 as S/D. A STI structure 130 is formed between the deep trenches 112 each other. The contact 138 is formed between the gates 104 electrically connect the bit line 106 and the S/D 134.

FIGS. 2a to 2i are cross-sections of the conventional method for forming a bottom electrode of a trench capacitor.

In FIG. 2a, a semiconductor substrate 201 having a dense trench area 21 and a less dense trench area 22 is provided. A pad oxide layer 202, a pad nitride layer 203, a borosilicate glass (BSG) layer 204, and a photoresist layer 205 with a plurality of openings 206 are sequentially formed on the semiconductor substrate 201. Portions of the BSG layer 204 are exposed via the openings 206 to define trenches described in the following.

In FIG. 2b, the exposed BSG layer is etched using the patterned photoresist layer 205 as an etching mask to form a plurality of openings 207 to expose portions of the pad nitride layers 203. The photoresist layer 205 is removed.

In FIG. 2c, the pad nitride layer, the pad oxide layer, and the semiconductor substrate 201 are an isotropically etched using the BSG layer 204 as an etching mask to form a plurality of trenches 208 as the semiconductor substrate 201. The BSG layer is removed. After the anisotropic etching, there are more trenches 208 in the dense trench area 21 than in the less dense trench area 22.

In FIG. 2d, an arsenic silicate glass (ASG) layer 209 is conformably formed as a bottom electrode of a capacitor on the exposed pad layer 203 and the exposed trenches 208.

In FIG. 2e, a photoresist layer is formed on the ASG layer 209, and the trenches 208 are filled with the ASG layer 209. The thickness of a photoresist layer 210a on the top surface of the dense trench area 21 is less than a photoresist layer 2310b on the less dense area 22 because there are more trenches 208 filled by the photoresist layer in the dense trench area 21.

In FIG. 2f, the photoresist layer 210a and 210b are etched to a predetermined depth in the trenches 208. Because a thickness of the photoresist layer 210a is thinner than the photoresist layer 210b, the photoresist layer 210a is removed before the photoresist layer 210b, and a height of a photoresist layer 210c in each trench 208 of the dense trench area 21 is lower than a photoresist layer 210d in each trench 208 of the less dense trench area 22.

In FIG. 2g, the ASG layer 209 is etched using the photoresist layer 210c and 210d as etching masks to leave an ASG layer 209a and 209b, and the ASG layer 209b is larger than the ASG layer 209a.

In FIG. 2h, the photoresist layer 210c and 210d are removed.

In FIG. 2i, the semiconductor substrate 201 is annealed to diffuse As ions to form the ASG layer 209a and 209b to form an As doped area 211a and 211b as bottom electrodes in the semiconductor substrate 201. The ASG layer 209a and 209b are removed.

The sizes of the bottom electrodes of the trench capacitors of the dense trench area 21 are different from the less dense trench area 22 because the sizes of the As doped area 211a and 211b are not similar.

SUMMARY OF THE INVENTION

The present invention is directed to a method for forming a uniform mask layer in trenches.

Accordingly, the present invention provides a method for filling a uniform mask layer in a trench of a trench capacitor. A semiconductor substrate is provided, in which the semiconductor substrate has a dense trench area and a less dense trench area with a plurality of trenches formed in both areas respectively. A mask layer is formed on the semiconductor substrate, and the trenches are filled with the mask layer. The mask layer is etched at an angle until the dense trench area and the less dense trench area in the semiconductor substrate are exposed to leave the mask layer in the trenches. The mask layers in the trenches are etched, such that a uniform thickness of the mask layer in each trench is achieved.

Accordingly, the present invention provides another method for filling a uniform mask layer in the trench of a trench capacitor of a DRAM. A semiconductor substrate is provided, a first liner layer and a second liner layer are sequentially formed thereon, and the semiconductor substrate has a dense trench area and a less dense trench area with a plurality of trenches formed in both areas respectively. A doped insulating layer is conformably formed on the second liner layer and the trenches. A photoresist layer is formed on the doped insulating layer, and the trenches are filled with the photoresist layer. The photoresist layer is etched at an angle until the dense trench area and the less dense trench area in the semiconductor substrate are exposed to leave the photoresist layer in the trenches. The photoresist layers in the trenches are etched, such that a uniform thickness of the photoresist layer in each trench is achieved. The doped insulating layer is etched using the photoresist layers as etching masks until the exposed doped insulating layer is then removed to leave the doped insulating layer in the trenches. The photoresist layer is removed. The doped insulating layers are diffused to form a plurality of doped areas in the semiconductor substrate, and the doped areas are substantially in size.

The present invention is also directed to a method forming a uniform bottom electrode in a trench of a trench capacitor.

Accordingly, the present invention provides a method for forming a uniform bottom electrode in a trench of a trench capacitor. A semiconductor substrate is provided, and the semiconductor substrate has a dense trench area and a less dense trench area with a plurality of trenches formed in both areas respectively. A first liner layer, a second liner layer, a mask layer, and a patterned photoresist layer with a plurality of openings are sequentially formed, and a portion of the mask layer is exposed via the openings. The exposed mask layer the second liner layer, the first liner layer, and the semiconductor substrate are sequentially etched using the patterned photoresist layer as an etching mask to form a plurality of trenches in a dense trench area and a less dense trench area. The patterned photoresist layer and the mask layer are sequentially removed. A doped glass layer is conformably formed on the second liner layer and the trenches. A photoresist layer is formed on the doped glass layer, and the trenches are filled with the photoresist layer. The photoresist layer is etched at an angle until the dense trench area and the less dense trench area in the semiconductor substrate are exposed to leave the photoresist layer in the trenches. The photoresist layer is etched to a predetermined depth in the trenches, and a remaining photoresist layer is formed. The exposed doped glass is removed using the remained photoresist layer as a mask. The remaining photoresist layer is removed. The semiconductor substrate is annealed to form an ion doped area as a bottom electrode in the semiconductor substrate. The doped glass is then removed.

BRIEF DESCRIPTION OF THE DRAWINGS

For a better understanding of the present invention, reference is made to a detailed description to be read in conjunction with the accompanying drawings, in which:

FIG. 1b is a cross-section at line BB of FIG. 1a;

DETAILED DESCRIPTION OF THE INVENTION

FIGS. 3a to 3j are cross-sections of a method for forming a bottom electrode of a trench capacitor of the present invention.

Figure 1A:
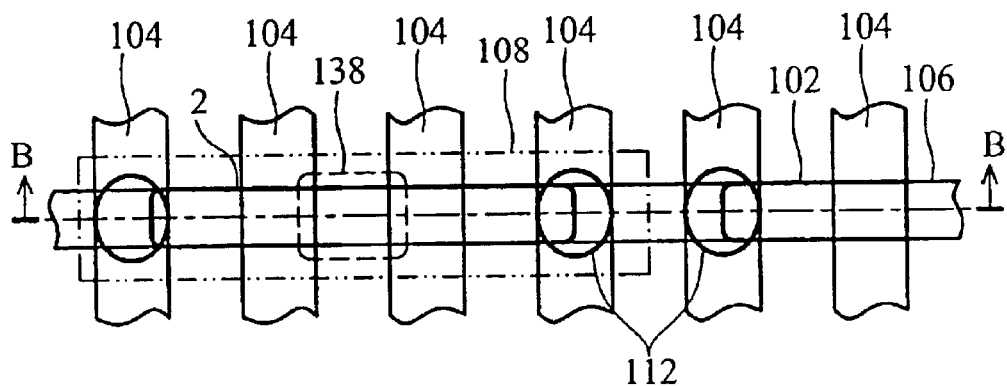
FIG. 1a is a top view of a deep trench array of a conventional DRAM.
Figure 1B:
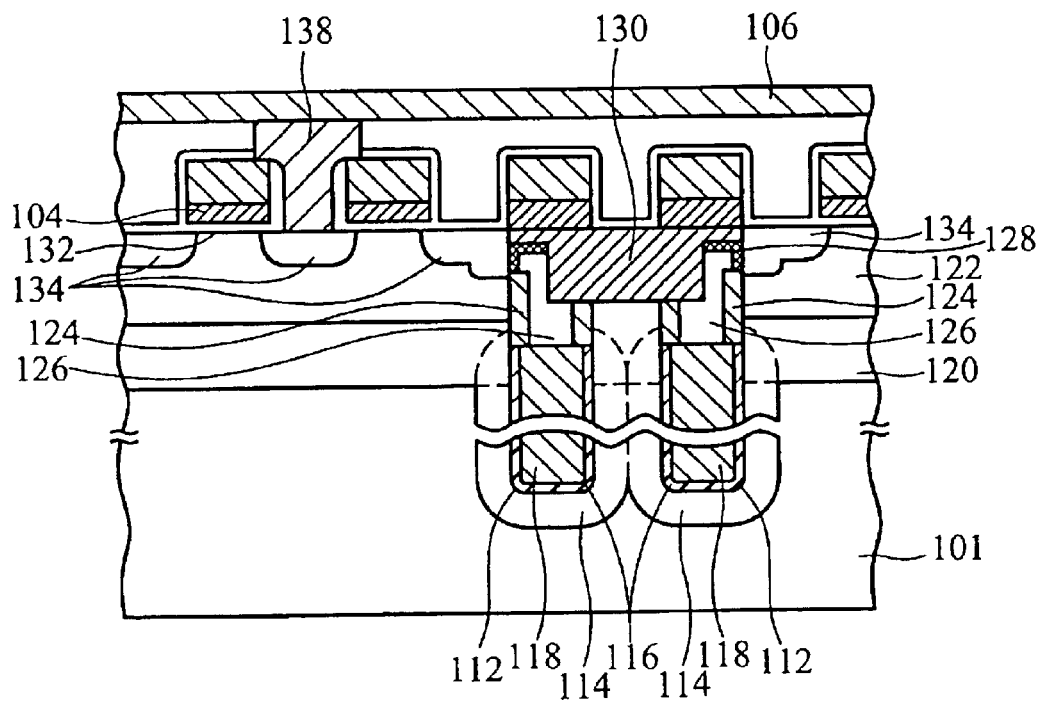
Figure 2A:
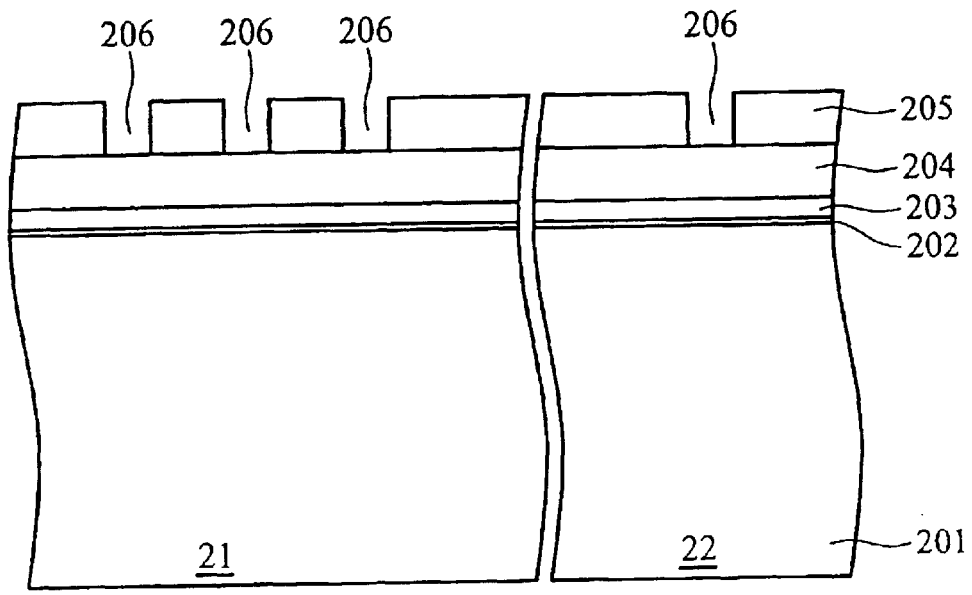
FIGS. 2a to 2i are cross-sections of the conventional method for forming a bottom electrode of a trench capacitor.
Figure 2B:
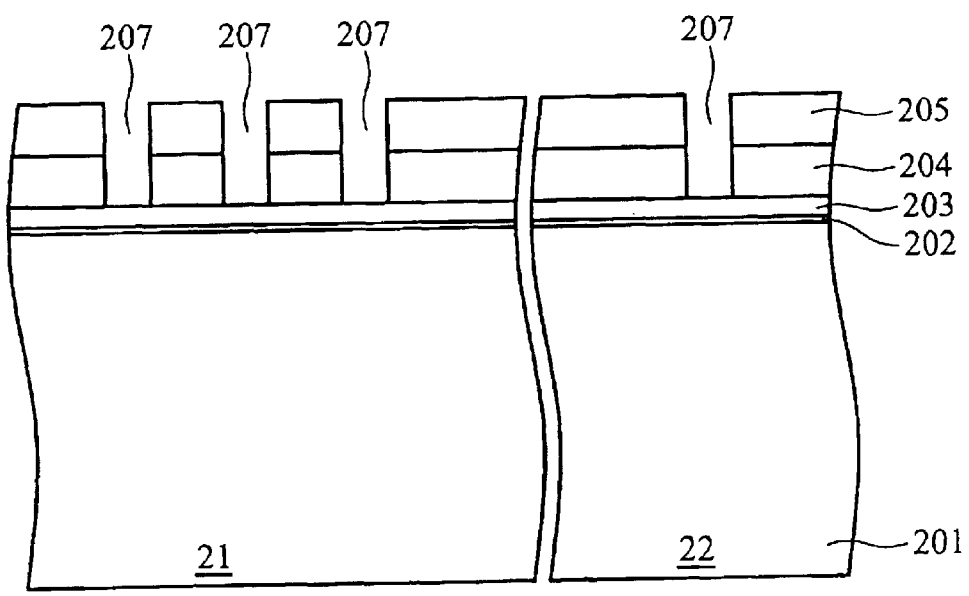
Figure 2C:
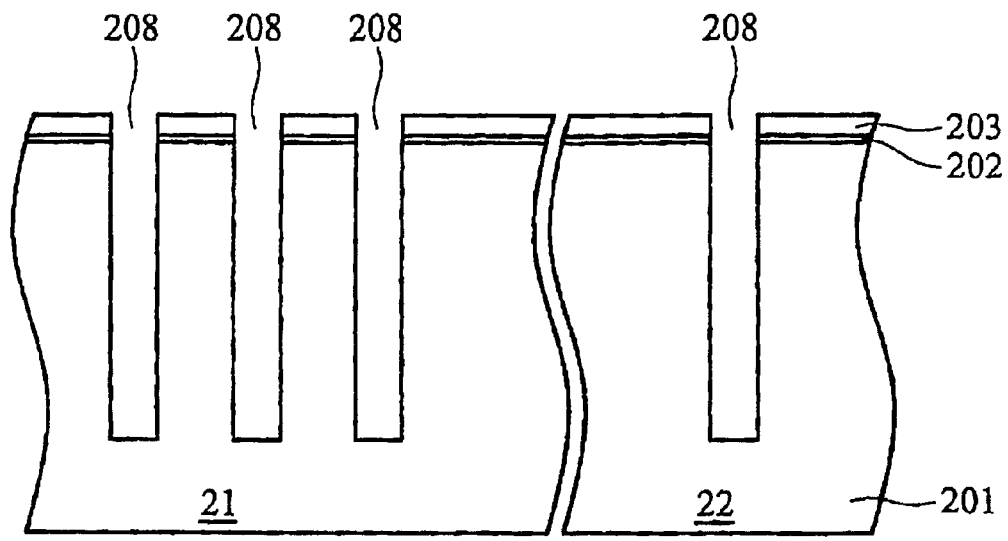
Figure 2D:
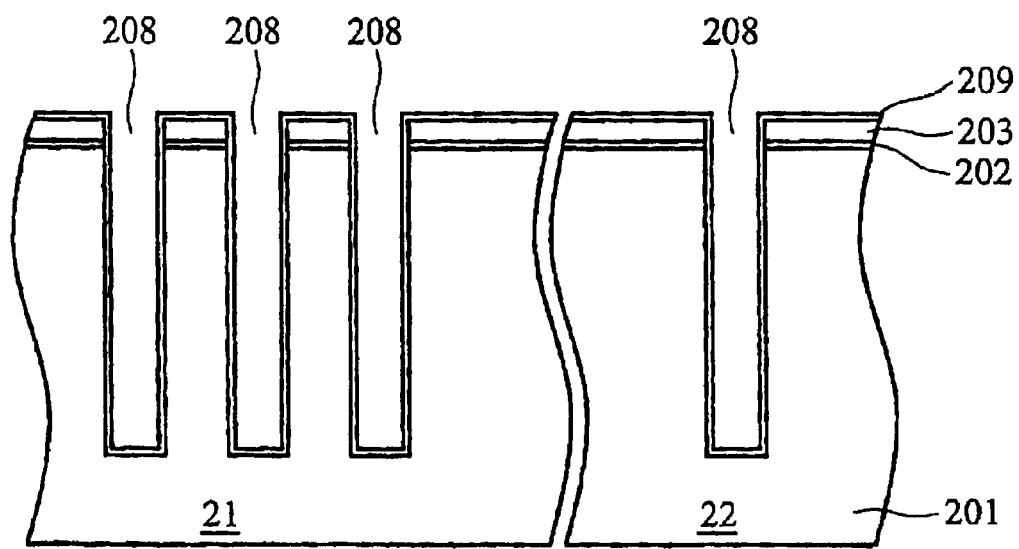
Figure 2E:
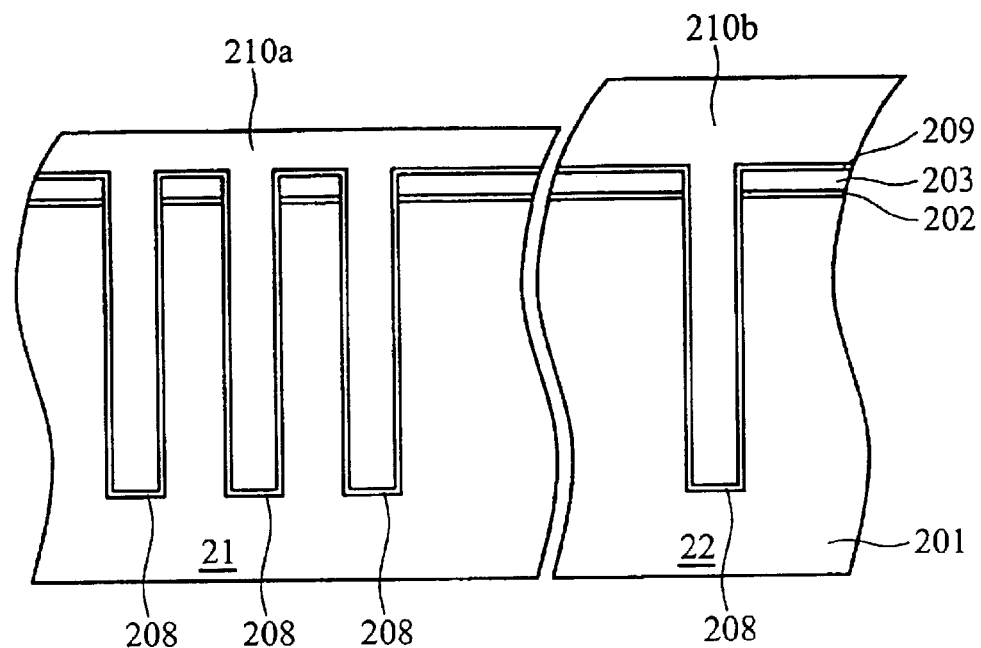
Figure 2F:
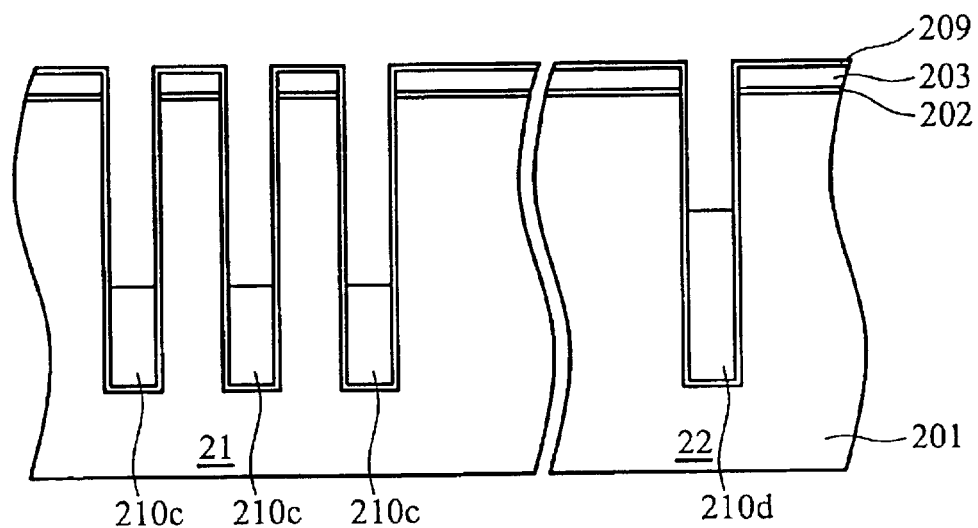
Figure 2G:
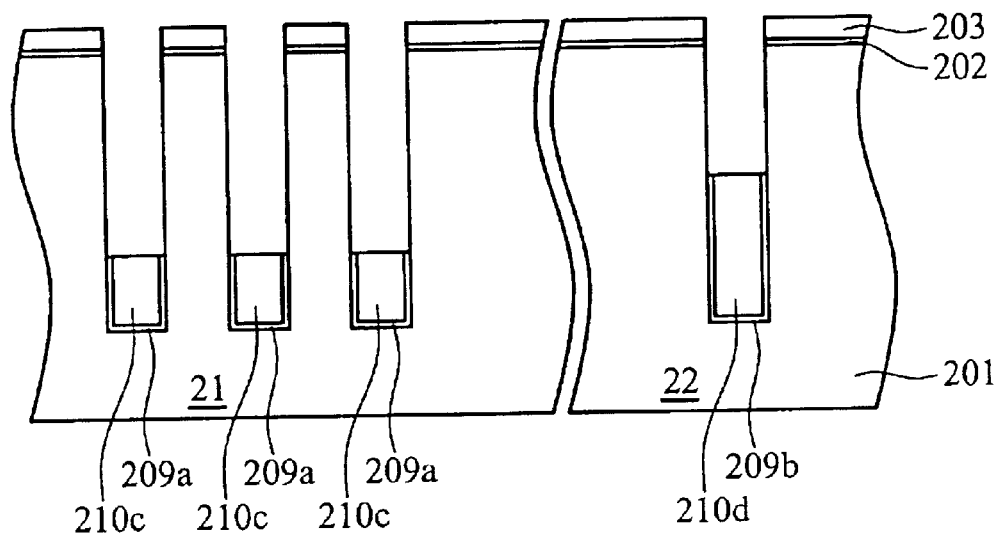
Figure 2H:
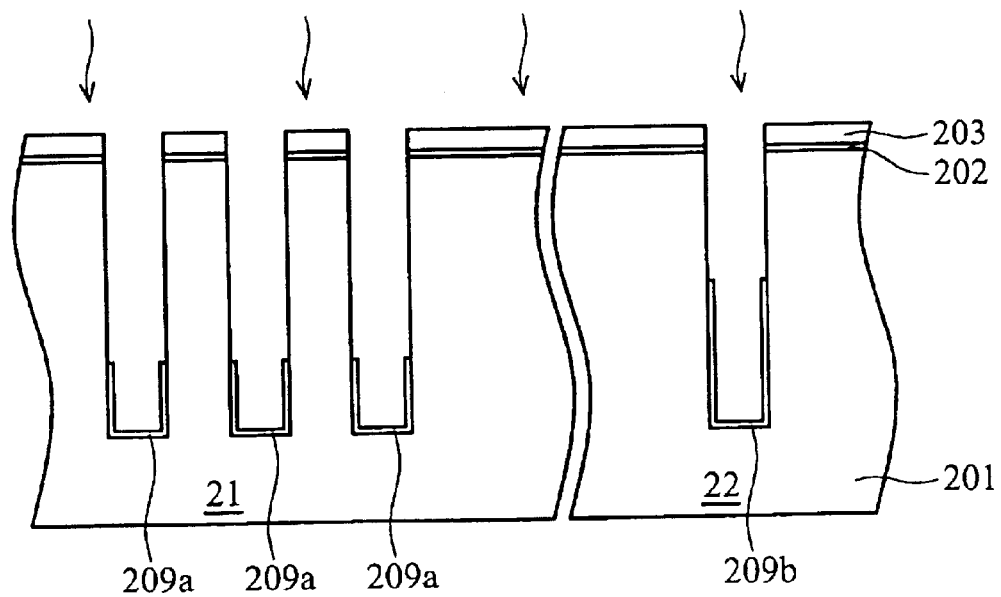
Figure 2I:
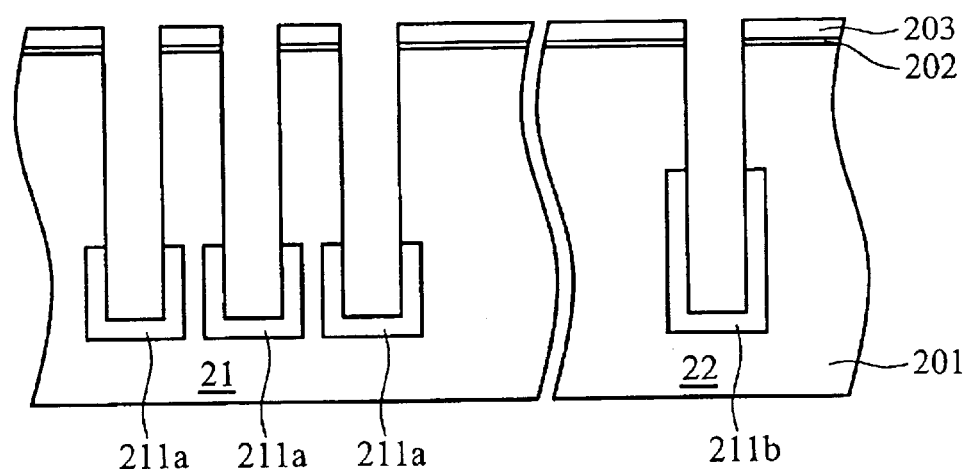
Figure 3A:
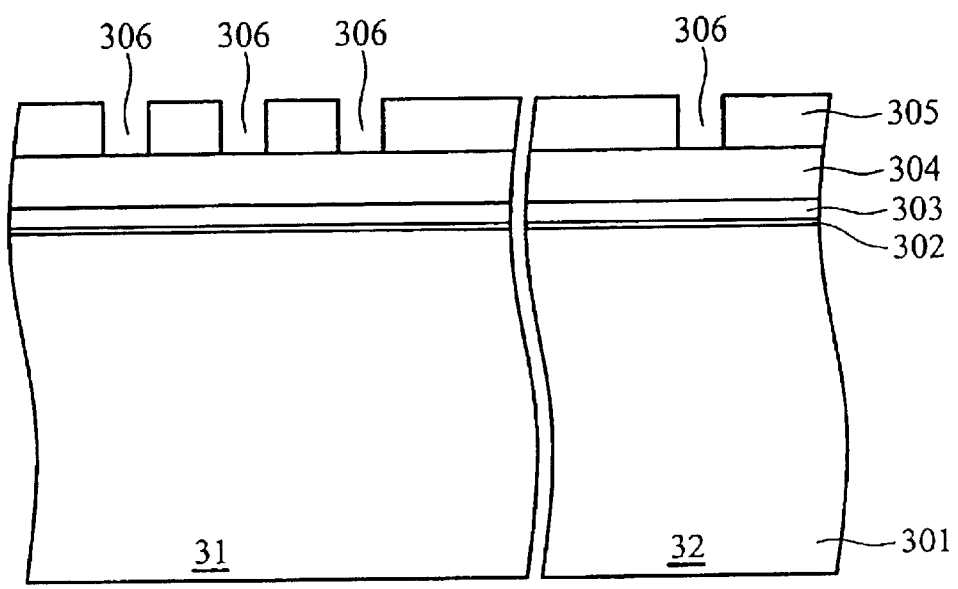
FIGS. 3a to 3j are cross-sections of a method for forming a bottom electrode of a trench capacitor of the present invention.

In FIG. 3a, a semiconductor substrate 301 having a dense trench area 31 and a less dense area 32 is provided. A pad layer 303, such as nitride layer, a hard mask layer 304, and a patterned photoresist layer 305 with a plurality of openings 306 are sequentially formed on the surface of the semiconductor substrate 301, and portions of the hard mask layers 304 are exposed via the openings 306. The hard mask layer 304 can be a borosilicate glass (BSG) layer or a complex layer with the BSG layer and a nitride layer to increase the quality of the trenches. A pad oxide layer 302 can be formed between the semiconductor substrate 201 and the pad layer 303 to help the formation of the pad layer 303 on the semiconductor substrate 301.

Figure 3B:
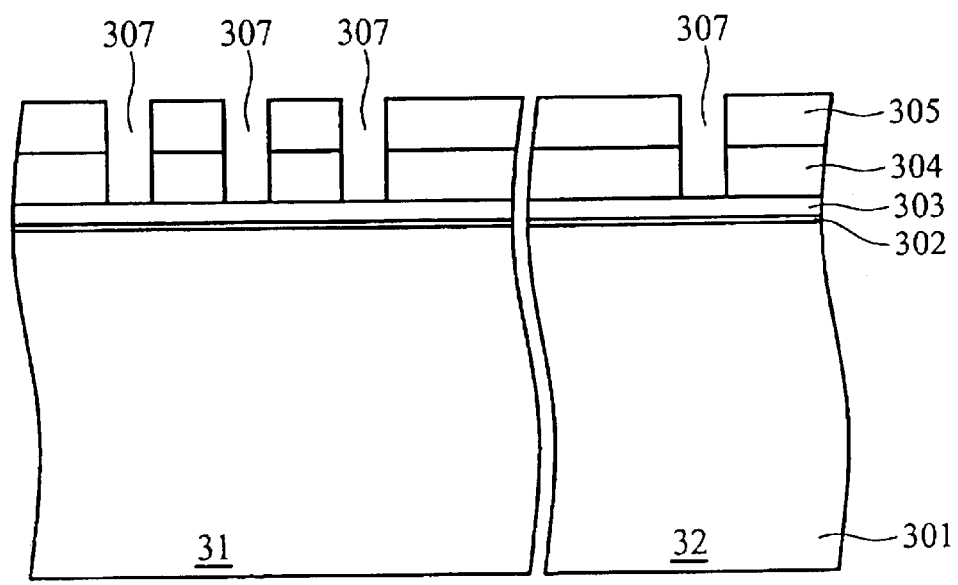

In FIG. 3b, the exposed hard mask layer 304 is etched using the patterned photoresist layer 305 as an etching mask to form a plurality of openings 307 to expose portions of the pad layers 303. The patterned photoresist layer 305 is removed.

Figure 3C:
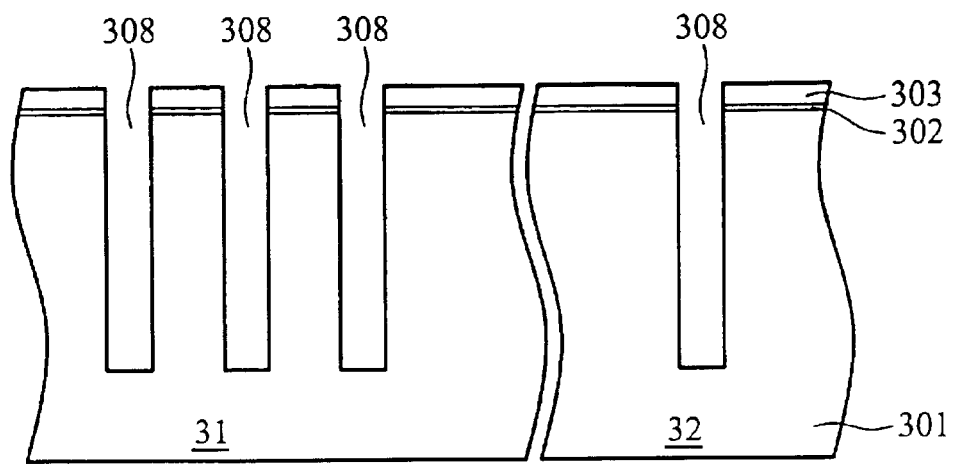

In FIG. 3c, the pad layer 303, the pad oxide layer 302, and the semiconductor substrate 301 are anisotropically etched by reactive ion etching or plasma etching using the hard mask layer 304 as an etching mask to form a plurality of trenches 308 in the semiconductor substrate 301. The hard mask layer 304 is removed. After anisotropic etching, there are more trenches 308 in the dense trench area 31 than in the less dense trench area 32.

Figure 3D:
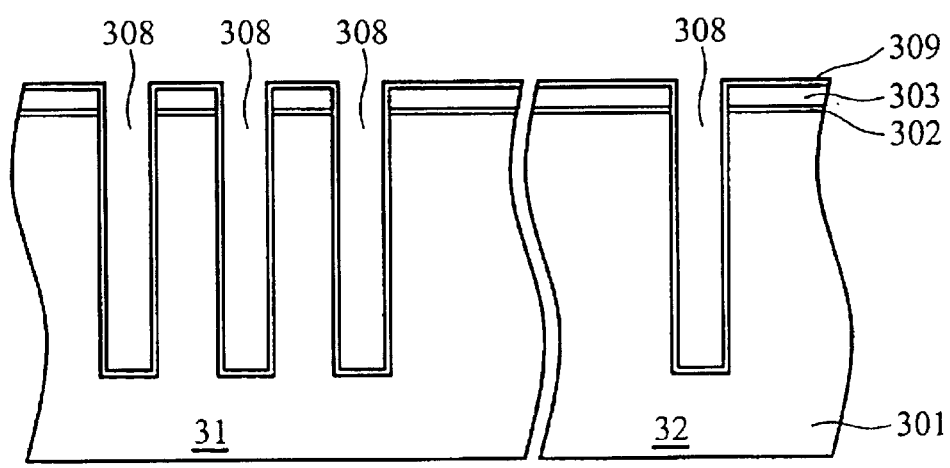

In FIG. 3d, a doped glass layer 309 is conformably formed on the exposed pad layer 303 and the exposed trenches 308. The doped glass layer 309, such as arsenic silicate glass (ASG) layer, is formed as a bottom electrode of a capacitor.

Figure 3E:
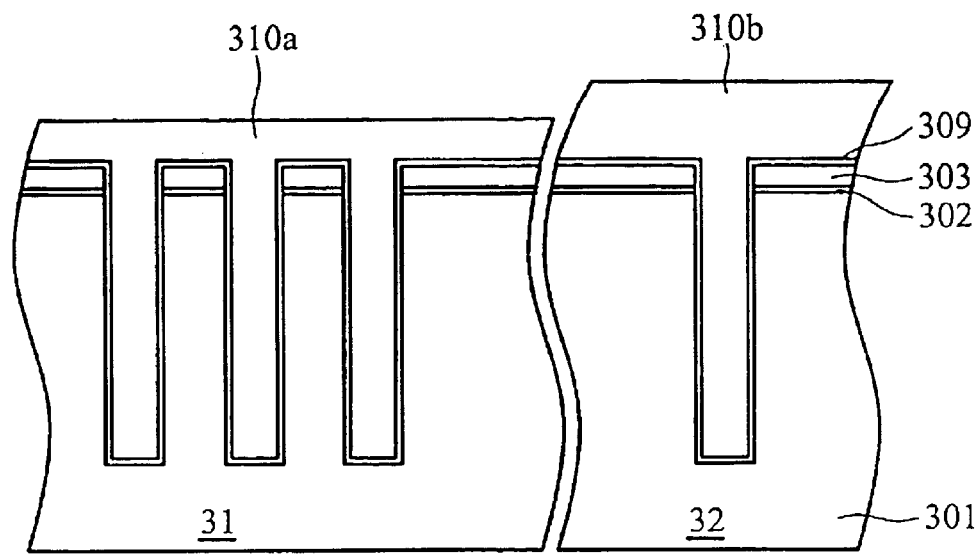

In FIG. 3e, a photoresist layer is formed on the doped glass layer 309, and the trenches 308 are filled with the doped glass layer 309. The thickness of the photoresist layer 310a on the top surface of the dense trench area 31 is less than the photoresist layer 310b on the less dense area 32 because there are more trenches 308 filled with photoresist layer in the dense trench area 31.

Figure 3F:
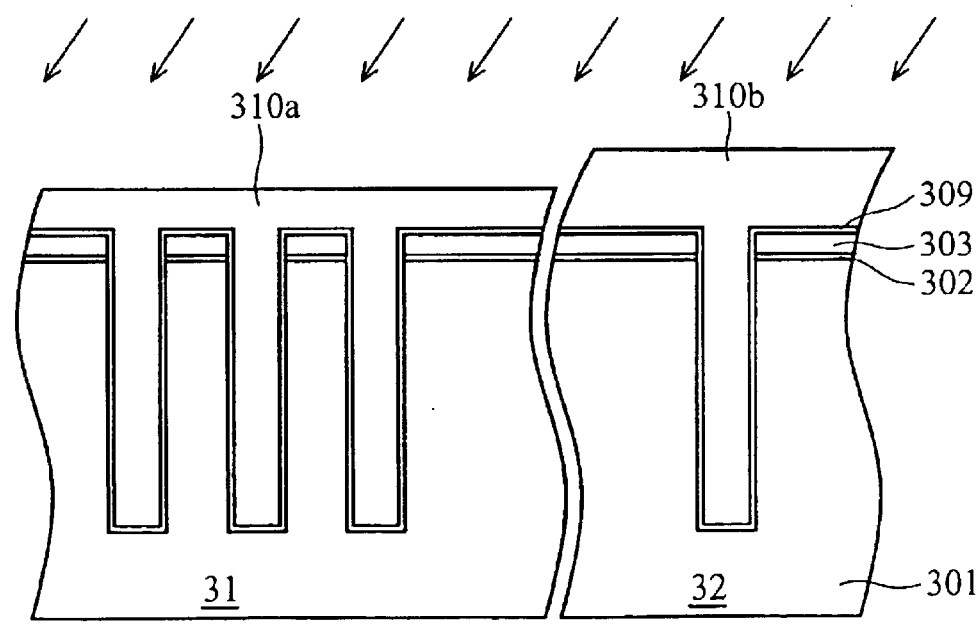

In FIG. 3f, the photoresist layer 310a and 310b are anisotropically etched at an angle greater than 45 degrees relative to the normal angle. The anisotropic etching can be reactive ion etching or plasma etching.

Figure 3G:
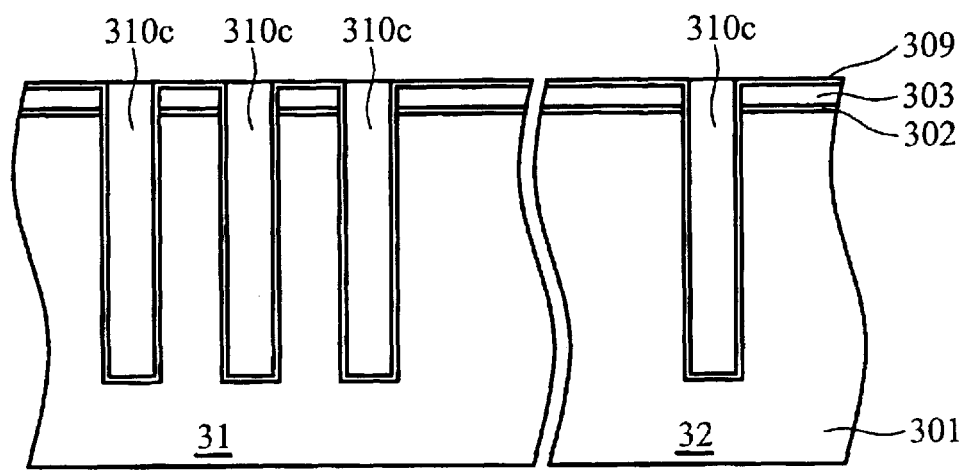

In FIG. 3g, the photoresist layers 310a and 310b on the top surface of the doped glass layer 309 are removed, and a photoresist layer 310c remains in the trenches 308.

The photoresist layer in the trenches 308 is difficult to etch at the predetermined angle, and therefore the thicknesses of the photoresist layer 310c in the trenches 308 are similar to each other after the photoresist layer 310b is etched at the predetermined angle relative to the normal angle.

Figure 3H:
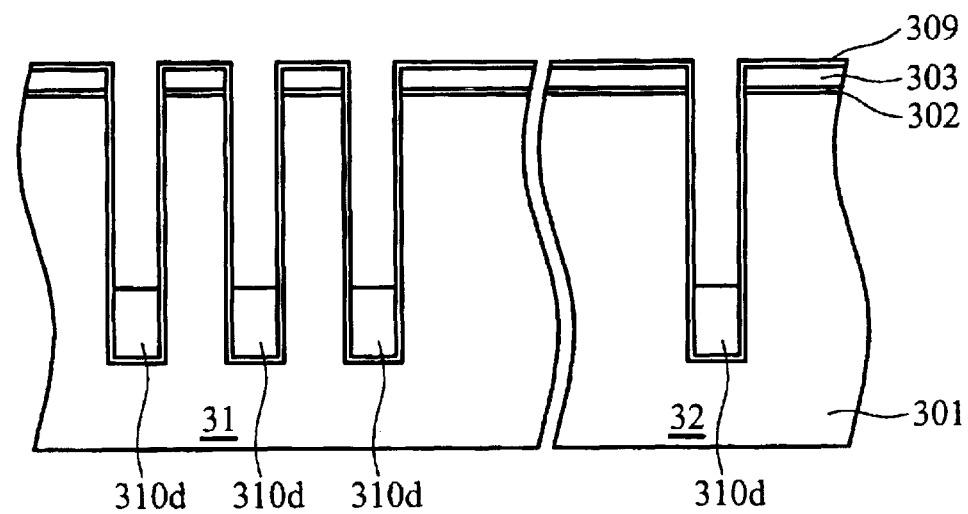

In FIG. 3h, the photoresist layer 310c is anisotropically etched to a predetermined depth in each trench 308 to form a photoresist layer 310d. Heights of the photoresist layers 310d in the trenches 308 of the dense trench area 31 and the less dense trench area 32 are broadly similar to each other.

Figure 3I:
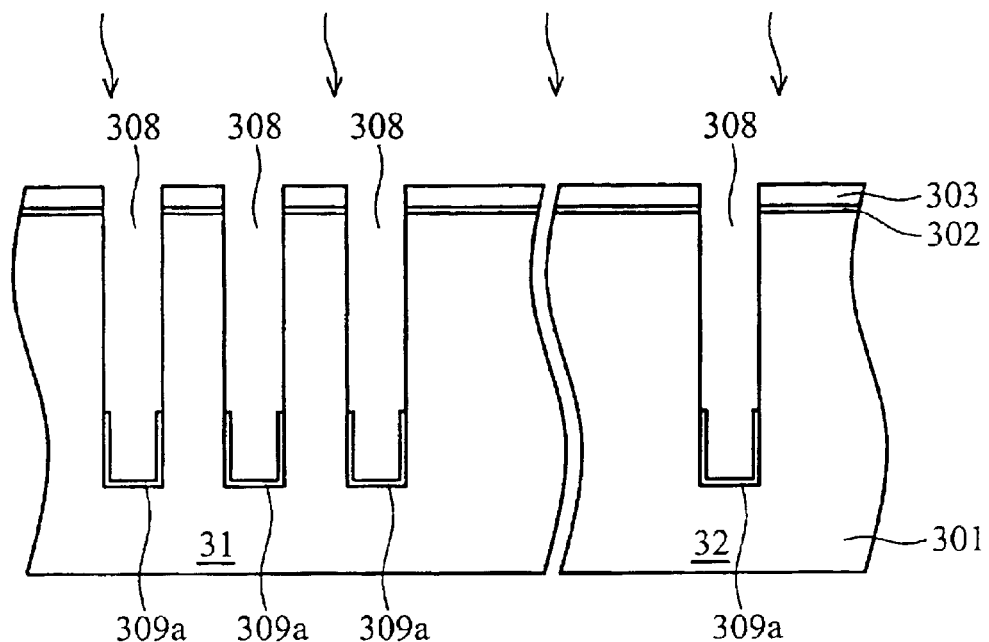

In FIG. 3i, the exposed doped glass layer 309 is wet etched by buffered oxide etching (BOE) solution using the photoresist layers 310d as etching masks to leave a doped glass layer 309a in each trench 308. The doped glass layers 309a in the trenches 308 of the dense trench area 31 and the less dense trench area 32 are substantially the same in size. The BOE solution contains $NH_4F$, HF, and $H_2O$, and the ratio is 5:1:48.

Figure 3J:
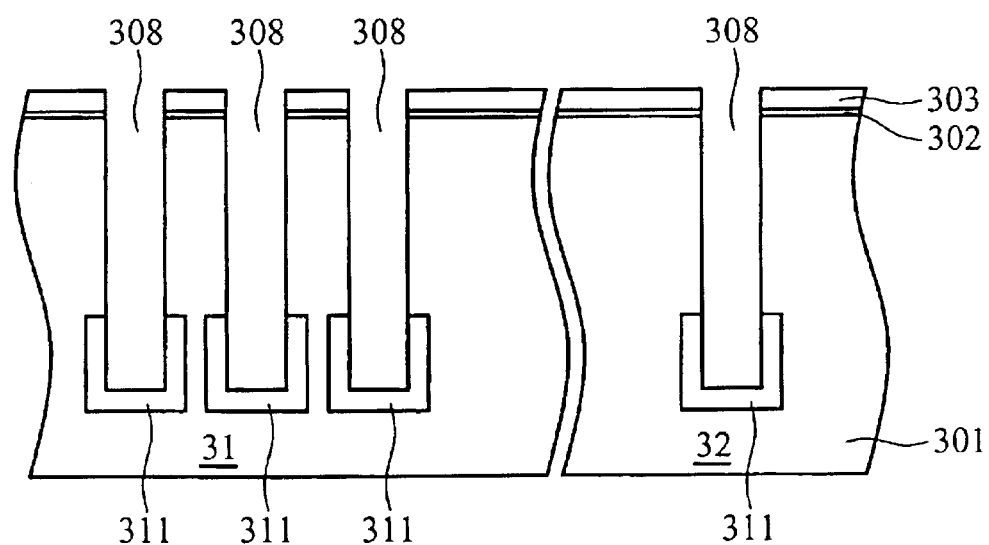

In FIG. 3j, the photoresist layer 310d is removed. The semiconductor substrate 301 is annealed at a predetermined temperature to diffuse ions from the doped glass layer 309a to the semiconductor substrate 301 to form ion doped areas 311 as bottom electrodes. The predetermined temperature is about 900 to 960° Celsius. The doped glass layer 309 is removed. The ion doped areas 311 can be As ion doped areas.

The ion doped areas 311 in the trenches 308 of the dense trench area 31 and the less dense trench area 32 are substantially the same in size because of the similar doped glass layers 309a. The varied size of the bottom electrodes of the trench capacitors between the dense trench area 31 and the less dense trench area 32 are prevented.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for filling a uniform mask layer in a trench of a trench capacitor, comprising:

providing a semiconductor substrate, wherein the semiconductor substrate has a dense trench area and a less dense trench area with a plurality of trenches formed in both areas respectively;

forming a mask layer covering the semiconductor substrate, wherein the trenches are filled with the mask layer;

anisotropically etching the mask layer at an angle until the dense trench area and the less dense trench area in the semiconductor substrate are exposed to leave the mask layer in the trenches; and etching the mask layers in the trenches, and a uniform thickness of the mask layer in each trench is achieved.

2. The method for filling a uniform mask layer in a trench of a trench capacitor of claim 1, wherein the angle is greater than 45 degrees relative to the normal angle.

3. The method for filling a uniform mask layer in a trench of a trench capacitor of claim 1, wherein the mask layer is a photoresist layer.

4. A method for filling a uniform mask layer in a trench of a trench capacitor of a DRAM, comprising:

providing a semiconductor substrate, wherein a first liner layer and a second liner layer sequentially formed thereon, and the semiconductor substrate has a dense trench area and a less dense trench area with a plurality of trenches formed in both areas respectively;

conformably forming a doped insulating layer covering the second liner layer and the trenches;

forming a photoresist layer covering the doped insulating layer and the trenches are filled with the photoresist layer;

anisotropically etching the photoresist layer at an angle until the dense trench area and the less dense trench area in the semiconductor substrate are exposed to leave the photoresist layer in the trenches;

etching the photoresist layers in the trenches, and a uniform thickness of the photoresist layers in each trench is achieved;

etching the doped insulating layer using the photoresist layers as etching masks until the exposed doped insulating layer is removed to leave the doped insulating layer in the trenches; removing the photoresist layer; and diffusing the doped insulating layers to form a plurality of doped areas in the semiconductor substrate, wherein the doped areas are substantially the same in size.

5. The method for filling a uniform mask layer in a trench of a trench capacitor of claim 4, wherein the first liner layer is a liner oxide layer.

6. The method for filling a uniform mask layer in a trench of a trench capacitor of claim 4, wherein the second liner layer is a liner nitride layer.

7. The method for filling a uniform mask layer in a trench of a trench capacitor of claim 4, wherein the doped insulating layer is an ASG layer.

8. The method for filling a uniform mask layer in a trench of a trench capacitor of claim 4, wherein the angle is greater than 45 degrees relative to the normal angle.

9. A method for forming a uniform bottom electrode in a trench of a trench capacitor, comprising:

providing a semiconductor substrate, wherein the semiconductor substrate has a dense trench area and a less dense trench area with a plurality of trenches formed in both areas respectively;

sequentially forming a first liner layer, a second liner layer, a mask layer, and a patterned photoresist layer with a plurality of openings, wherein a portion of the mask layer is exposed via the openings;

sequentially etching the exposed mask layer, the second liner layer, the first liner layer, and the semiconductor substrate using the patterned photoresist layer as an etching mask to form a plurality of trenches in a dense trench area and a less dense trench area;

sequentially removing the patterned photoresist layer and the mask layer;

conformably forming a doped glass layer covering the second liner layer and the trenches;

forming a photoresist layer covering the doped glass layer, and the trenches are filled with the photoresist layer;

anisotropically etching the photoresist layer at an angle until the dense trench area and the less dense trench area in the semiconductor substrate are exposed to leave the photoresist layer in the trenches;

etching the photoresist layer to a predetermined depth in the trenches, and a remaining photoresist layer is formed;

removing the exposed doped glass layer using the remaining photoresist layer as a mask;

removing the remaining photoresist layer;

annealing the semiconductor substrate to form an ion doped area as a bottom electrode in the semiconductor substrate; and removing the doped glass.

10. The method for forming a uniform bottom electrode in a trench of a trench capacitor of claim 9, wherein the first liner layer is a liner oxide layer.

11. The method for forming a uniform bottom electrode in a trench of a trench capacitor of claim 9, wherein the second liner layer is a liner nitride layer.

12. The method for forming a uniform bottom electrode in a trench of a trench capacitor of claim 9, wherein the mask layer is a BSG layer.

13. The method for forming a uniform bottom electrode in a trench of a trench capacitor of claim 9, wherein the doped insulating layer is an ASG layer.

14. The method for forming a uniform bottom electrode in a trench of a trench capacitor of claim 10, wherein the angle is greater than 45 degrees relative to the normal angle.

* * * * *